(12) United States Patent
Bruls et al.

(10) Patent No.: US 7,379,154 B2
(45) Date of Patent: May 27, 2008

(54) LITHOGRAPHIC APPARATUS, DEVICE MANUFACTURING METHODS, MASK AND METHOD OF CHARACTERIZING A MASK AND/OR PELLICLE

(75) Inventors: Richard Joseph Bruls, Eindhoven (NL); Orlando Serapio Cicilia, Eindhoven (NL); Hendrikus Alphonsus Ludovicus Van Dijck, Veldhoven (NL); Gerardus Carolus Johannus Hofmans, Eindhoven (NL); Tammo Uitterdijk, De Bilt (NL)

(73) Assignee: ASML Netherlands, B.V., Veldhoven (NL)

( * ) Notice: Subject to any disclaimer, the term of this patent is extended or adjusted under 35 U.S.C. 154(b) by 0 days.

(21) Appl. No.: 10/835,287

(22) Filed: Apr. 30, 2004

(65) Prior Publication Data

US 2005/0140949 A1    Jun. 30, 2005

(30) Foreign Application Priority Data

Apr. 30, 2003   (EP) ................................. 03252717
Aug. 19, 2003   (EP) ................................. 03255130

(51) Int. Cl.
*G03B 27/42*   (2006.01)
*G03B 27/62*   (2006.01)

(52) U.S. Cl. ............................. 355/53; 355/55; 355/75; 378/35; 430/5; 430/20; 430/22; 430/322

(58) Field of Classification Search ................. 355/53, 355/75, 55; 378/35; 430/5, 2, 22, 322, 20
See application file for complete search history.

(56) References Cited

U.S. PATENT DOCUMENTS

| | | | |
|---|---|---|---|
| 5,581,324 A | 12/1996 | Miyai et al. | |
| 6,101,237 A * | 8/2000 | Miyachi et al. | 378/35 |
| 6,436,586 B1 * | 8/2002 | Matsuoka et al. | 430/5 |
| 6,480,260 B1 | 11/2002 | Donders et al. | |
| 2001/0004508 A1 * | 6/2001 | Shirasaki | 430/5 |
| 2001/0014375 A1 * | 8/2001 | Tanaka | 428/14 |
| 2002/0018190 A1 | 2/2002 | Nogawa et al. | |
| 2002/0086224 A1 * | 7/2002 | Kanda | 430/5 |
| 2002/0145716 A1 | 10/2002 | Kurosawa | |
| 2003/0016338 A1 | 1/2003 | Yasuda et al. | |
| 2003/0095245 A1 * | 5/2003 | Mishiro et al. | 355/75 |
| 2003/0117609 A1 * | 6/2003 | Kamono | 355/75 |

(Continued)

FOREIGN PATENT DOCUMENTS

EP    2 138 163 A    10/1984

(Continued)

OTHER PUBLICATIONS

Search Report for European Application No. EP 04252493.4, dated Sep. 6, 2004.

(Continued)

*Primary Examiner*—D. Rutledge
(74) *Attorney, Agent, or Firm*—Pillsbury Winthrop Shaw Pittman LLP

(57) ABSTRACT

A thick pellicle is allowed to have a non-flat shape and its shape is characterized to calculate corrections to be applied in exposures to compensate for the optical effects of the pellicle. The pellicle may be mounted so as to adopt a one-dimensional shape under the influence of gravity to make the compensation easier.

18 Claims, 7 Drawing Sheets

U.S. PATENT DOCUMENTS

| | | | |
|---|---|---|---|
| 2003/0124440 A1* | 7/2003 | Eynon | 430/5 |
| 2003/0197848 A1 | 10/2003 | Shiraishi | |
| 2003/0197851 A1* | 10/2003 | Aoyama | 355/75 |
| 2004/0125911 A1* | 7/2004 | Chiba et al. | 378/35 |
| 2004/0151990 A1* | 8/2004 | Ganguli et al. | 430/5 |
| 2004/0194556 A1* | 10/2004 | Shu et al. | 73/862.045 |
| 2005/0186488 A1* | 8/2005 | Su et al. | 430/5 |

FOREIGN PATENT DOCUMENTS

| | | |
|---|---|---|
| EP | 0 552 953 A1 | 7/1993 |
| EP | 0 831 376 A2 | 3/1998 |
| EP | 0 831 376 A3 | 4/2000 |
| EP | 1 207 425 A2 | 5/2002 |
| EP | 1 286 223 A1 | 2/2003 |
| EP | 1 341 221 A1 | 9/2003 |
| JP | 61-168919 | 7/1986 |
| JP | 62065326 | 3/1987 |
| WO | WO 02/43123 A1 | 5/2002 |

OTHER PUBLICATIONS

Search Report for European Application No. EP 04252493.4, dated Jan. 25, 2005.

Japanese Office Action issued for Japanese Patent Application No. 2004-132528, dated Apr. 25, 2007.

* cited by examiner

LITHOGRAPHIC APPARATUS, DEVICE MANUFACTURING METHODS, MASK AND METHOD OF CHARACTERIZING A MASK AND/OR PELLICLE

This application claims priority to European Application Nos. 03252717.8, filed Apr. 30, 2003 and 03255130.1, filed Aug. 19, 2003, the contents of which are incorporated herein in their entirety.

BACKGROUND OF THE INVENTION

1. Field of the Invention

The present invention relates generally to lithographic apparatus and device manufacturing methods using lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

A pellicle is a thin, transparent film that is attached by a frame to the chrome side of a mask or reticle used in lithography. The pellicle and its frame keep the space near the chrome of the mask free of dust particles. In this way, any dust particles near the mask are kept away from the best object plane and will thus be imaged out of focus and will not cause defects. However, the standard pellicle material, a polymer film, can not be used when 157 nm radiation is used as the exposure radiation. The polymer film is not transparent to this wavelength and the exposure radiation would deteriorate the optical properties of the pellicle.

Therefore, a new pellicle material that is suitable for 157 nm radiation has been sought. The best solution found so far is to use fluorine-doped quartz. This is an inorganic material. In order to use it as a pellicle, the pellicle thickness has to be substantially increased, e.g., to 800 μm. Because the pellicle material has a different refractive index than the surrounding gas, such a thick pellicle causes imaging effect which cannot be neglected.

The main effect is an observed object plane shift. From behind the pellicle the object appears to be closer than it actually is. With an 800 μm thick pellicle that has a refractive index of 1.5, the observed object plane shift is about 280 μm. Because the object appears to have moved towards the projection system, this can be corrected by moving the mask stage away from the projection lens by about 280 μm. However, any deviations from planarity or in thickness of the pellicle will introduce other aberrations which will have undesirable effects on imaging.

SUMMARY OF THE INVENTION

One aspect of embodiments of the present invention provides lithographic projection apparatus and device manufacturing methods in which the effects of a thick pellicle can be compensated for or ameliorated.

According to an aspect of the invention there is provided a lithographic projection apparatus including: an illumination system for supplying a projection beam of radiation, a support structure for supporting a patterning device, the patterning device serving to pattern the projection beam according to a desired pattern, a substrate table for holding a substrate, a projection system for projecting the patterned beam onto a target portion of the substrate, and a layer, substantially transparent to the projection beam but having a refractive index different than the surrounding medium, in the optical path of the projection beam between the patterning device and the substrate, a storage device adapted to store information relating to the physical and/or optical characteristics of the layer, a controller adapted to control at least one of the projection system, the radiation system, the substrate table and the support structure in response to information stored in the storage device to compensate for or ameliorate imaging aberrations caused by the layer other than a displacement of the apparent mask position along the optical axis of the apparatus.

Rather than attempting to make a pellicle that is sufficiently flat and of uniform thickness and optical properties that its effects on imaging of the mask are within acceptable limits, the present invention accepts that the pellicle will introduce aberrations and compensates for or ameliorates them by adjusting other parts of the apparatus. For example, certain aberrations, such as spherical aberrations and magnification errors (especially in the non-scanning direction), caused by the pellicle may be compensated for by adjusting elements in the projection system. Others, such as image translations and magnification errors in the scanning direction may be compensated for by control of the mask and substrate table positions during an exposure or adjusting other parts of the apparatus.

The information relating to physical and/or optical properties of the pellicle may include data relating to the thickness and refractive index variations across its area, as well as its three-dimensional shape, in particular local tilt values. Alternatively, the information may comprise corrections to be applied in an exposure that are pre-calculated from such data.

The properties of the pellicle may be measured by an off-line tool such as an interferometer, especially a Fourier transform phase shift interferometer, in which case the apparatus preferably further provides an interface for receiving the information in conjunction with the loading of a mask into the apparatus. The interface may comprise a network interface device for receiving the information via a network in the fab or a removable media reader for reading the information from a data carrier accompanying the mask. With such an arrangement, the characterization of the pellicle and calculation of corrections can be carried out as thoroughly as necessary without increasing the time taken for changing masks and hence with no reduction in throughput.

Alternatively, the apparatus may be provided with a suitable image sensor, such as a transmission image sensor or white light interferometer, and the controller may be further adapted to control the sensor and/or the mask table to characterize the pellicle in situ. In this way, the possibility of error caused by changes in the pellicle shape between off-line characterization and use for exposures is reduced.

According to a further aspect of the invention there is provided a device manufacturing method including: providing a substrate that is at least partially covered by a layer of radiation-sensitive material, providing a projection beam of radiation using a radiation system, using a mask having a pellicle in spaced relation thereto to endow the projection beam with a pattern in its cross-section, projecting the patterned beam of radiation onto a target portion of the layer of radiation-sensitive material, in the projecting, corrections are applied to at least one of the radiation system, the projection system, the position of the mask and the position of the substrate to compensate for or ameliorate aberrations other than a shift in apparent position of the mask in the direction of the optical axis of the projection system caused by the pellicle, the corrections having been determined from information relating to the physical and/or optical characteristics of the pellicle.

According to yet a further aspect of the invention there is provided a mask having a pellicle fixed to a frame in spaced relation thereto, wherein the pellicle is fixed to the frame along two parallel edges and compliantly mounted along the other edges such that the pellicle adopts a one-dimensional shape when in the orientation in which it will be used for exposures in a lithographic projection apparatus.

Because it is fixed along two opposite edges only, the pellicle will adopt under the influence of gravity a predictable shape which results in a predictable image displacement (error) which can be corrected for during exposures. The error can also be easily measured using an image sensor such as a transmission image sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE PRESENT INVENTION

Embodiment 1

Figure 1:
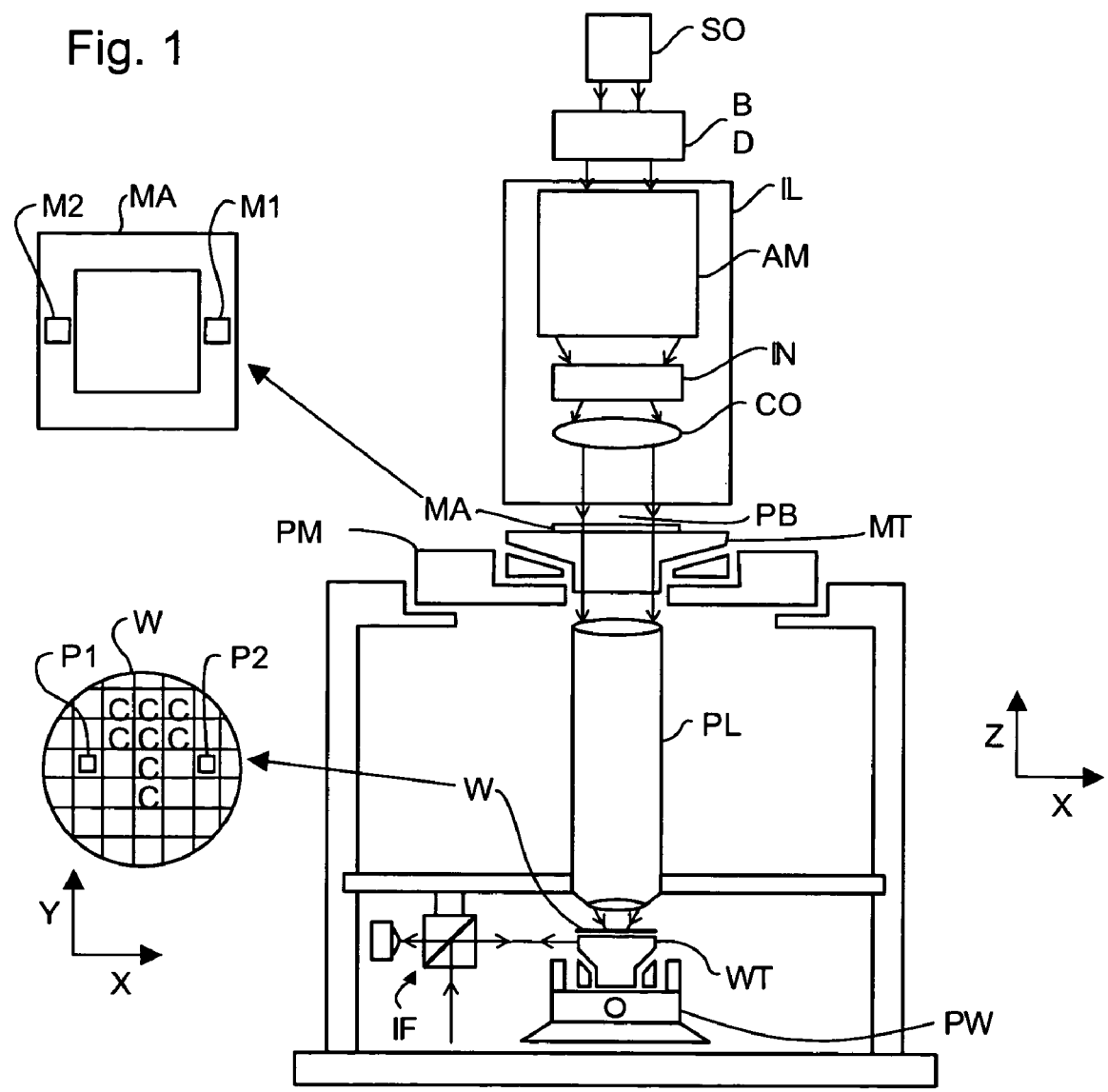
FIG. 1 depicts a lithographic projection apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g., UV radiation or DUV radiation).
- a first support structure (e.g., a mask table) MT for supporting patterning device (e.g., a mask) MA and connected to a first positioner PM for accurately positioning the patterning device with respect to item PL;
- a substrate table (e.g., a wafer table) WT for holding a substrate (e.g., a resist-coated wafer) W and connected to a second positioner PW for accurately positioning the substrate with respect to item PL; and
- a projection system (e.g., a refractive projection lens) PL for imaging a pattern imparted to the projection beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjusting mechanism AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g., an interferometric device), the substrate table WT can be moved accurately, e.g., so as to position different target portions C in the path of the beam PB. Similarly, the first positioner PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
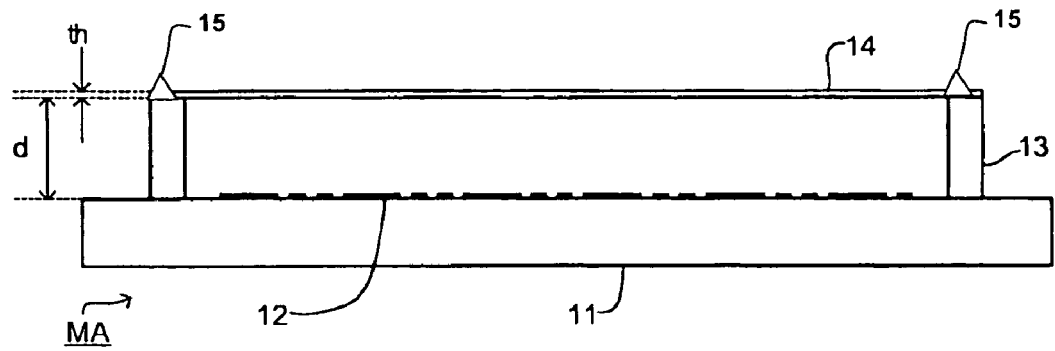
FIG. 2 depicts a mask and pellicle.

FIG. 2 shows a mask MA which comprises a transparent, e.g., quartz, substrate 11 on one face of which is provided a chrome pattern 12 representing the pattern which is to be printed on a substrate. A frame 13 surrounds the chrome pattern and supports a pellicle 14 in spaced relation to the mask MA. The pellicle 14 is a thin, transparent membrane that protects the chrome pattern and in particular prevents dust particles from settling on the chrome pattern. Frame 13 is sized so that the pellicle is spaced from the plane of the chrome pattern 12 by a distance d, e.g., about 5 mm, sufficient that any dust particle adhering to the pellicle is out of focus during an exposure and does not print in the resist on the substrate.

The pellicle must be made of a material that is transparent to the exposure radiation and should be as thin as possible; mechanical considerations (including pellicle dynamics such as acoustic vibrations, scan speed-induced deformation, etc.) determine the minimum thickness of the pellicle. For exposure radiation at 157 nm, polymer materials used at longer wavelengths are insufficiently transparent and would absorb energy from the projection beam rapidly enough to deteriorate. A pellicle for 157 nm can be made of fluorine-doped quartz but for mechanical reasons must have a thickness of about 800 µm. Due to this thickness, the pellicle introduces a shift in the Z direction (parallel to the optical axis of the projection system) of the apparent position of the chrome pattern or, looking at it another way, in the best focal plane. Using Snell's law, this shift ΔOP is given by:

$$\Delta OP = th \left[ 1 - \frac{n_1 \cos(i)}{n_2 \cos(r)} \right] \quad (1)$$

or equivalently:

$$\Delta OP = th \left[ 1 - \frac{\cos(i)}{\sqrt{\left(\frac{n_2}{n_1}\right)^2 - \sin^2(i)}} \right] \quad (1a)$$

where th is the thickness of the pellicle, $n_1$ is the refractive index of the surrounding medium (air, vacuum or flushing gas) $n_2$ is the refractive index of the pellicle, i is the angle of the beam in the surrounding medium (determined by the illumination settings NA and σ) and r the angle of the beam in the pellicle.

Further, if the pellicle is locally non-parallel to the mask, there will be an apparent distortion of the pattern, $d_r$, given by:

$$d_r = \alpha \cdot \Delta OP \approx \alpha \cdot th \left[ 1 - \frac{n_1}{n_2} \right] \quad (2)$$

The resulting distortion of the projected image at substrate level is reduced by the magnification, M (e.g., ¼), of the projection system and is given by:

$$d_w = \alpha \cdot M \cdot \Delta OP \approx \alpha \cdot M \cdot th \left[ 1 - \frac{n_1}{n_2} \right] \quad (3)$$

Figure 3:
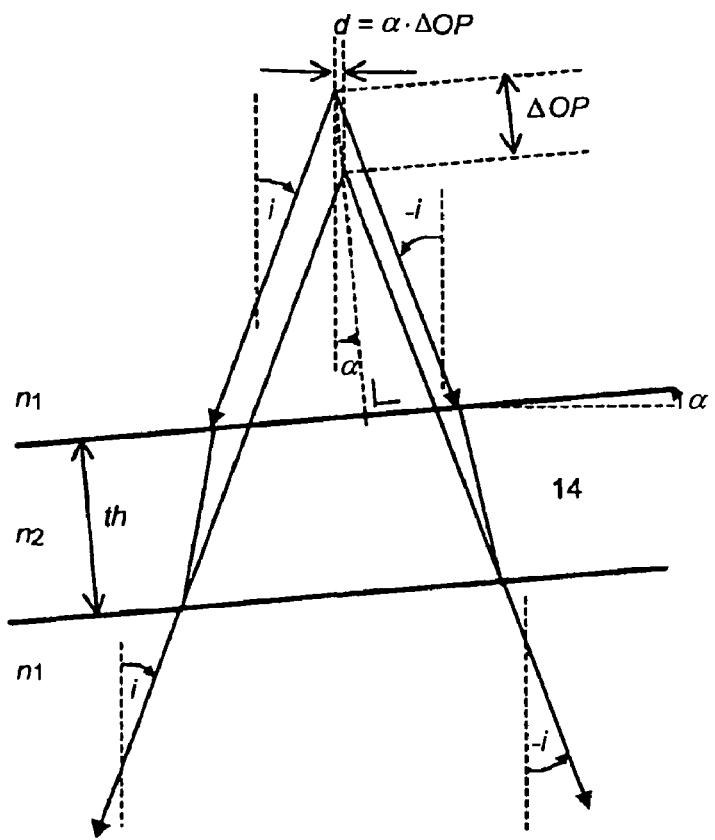
FIG. 3 is a diagram showing the displacement of the apparent mask position due to an inclined pellicle.

These effects are illustrated in FIG. 3.

According to the present invention, the pellicle shape and thickness are measured and the imaging effects (e.g., distortion (shape), defocus (thickness)) introduced by the shape and thickness are corrected for. In general, pellicle deformation (local tilt) results in an image displacement (distortion). The pellicle thickness (variation) is of importance to obtain the best object plane. In order to reduce the induced distortion and focus errors system adjustments are applied.

The benefit of performing these adjustments (or better measuring or predicting the pellicle shape) is that the specifications put on the pellicle shape can be relaxed while giving comparable overlay and focus performance to a perfectly flat pellicle. Thus each pellicle is individually measured and corrected for, providing additional flexibility.

In the first embodiment of the invention, the pellicle shape is measured using an off-line tool such as an interferometer. The measured pellicle shape can be used to calculate several system corrections such as translation (x and y), magnification (Mx), scan scaling (My), etc. It is also possible to determine symmetric rotation (scan skew and lens rotation) (pellicle shape=f(x*y)) introduced by the pellicle. Furthermore, the thickness (variation) can be measured using the interferometer which can be used to determine the shift in best object plane with respect to the case when no pellicle is present. These correctables are fed into the system to accommodate for the pellicle shape.

By way of an example, the shape and thickness of a pellicle was measured using a Zygo VeriFire MST 1550 (™) FTPSI (Fourier Transform Phase Shift Interferometer) tool. The Zygo tool is a precision interferometric optical system that can be used to measure the distances between several surfaces, optical path lengths, refractive indices, etc. The measured shape was described using a polynomial fit and the fitting parameters were translated into system correctables. In other words, the measured pellicle shape is described as a function of (x, y, x.y, $x^2$, $y^2$, $x^4$, $x^6$, etc. ) and then transformed into a function of (translation x, translation y, symmetric rotation (scan skew and lens rotation), Magnification y, Magnification x, third order distortion, fifth order distortion, etc.).

Figure 4:
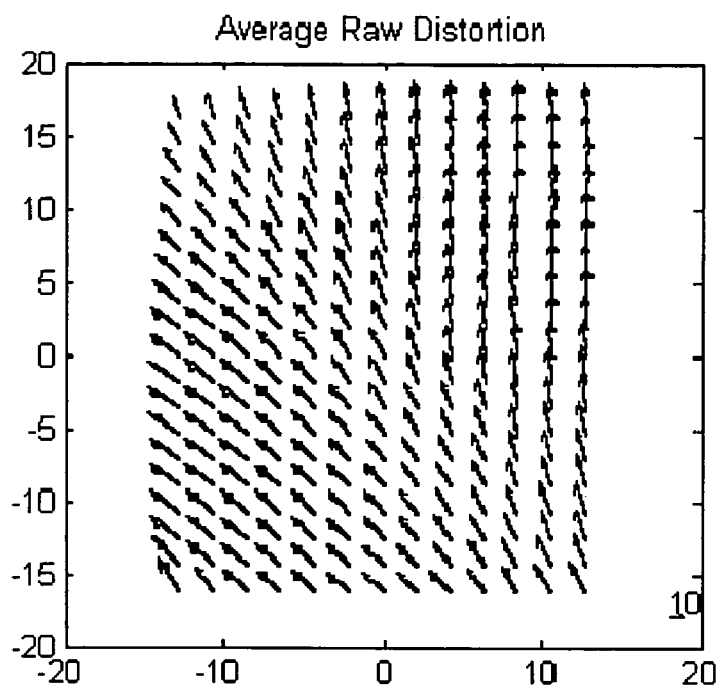
FIG. 4 is a diagram of predicted average raw distortion due to a non-uniform pellicle.
Figure 5:
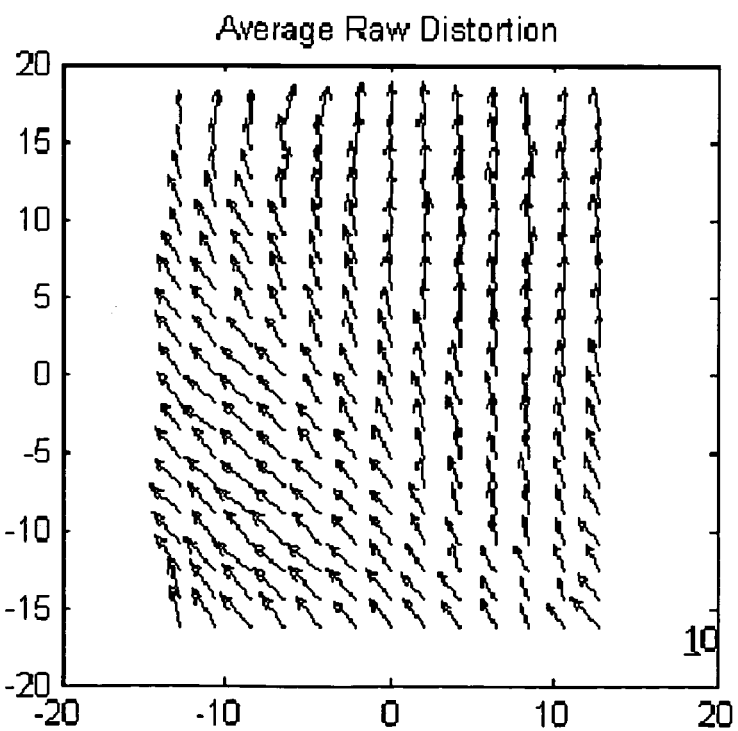
FIG. 5 is a diagram of measured average raw distortion due to a non-uniform pellicle.

Using the information of the measured pellicle shape the distortion induced by the pellicle was calculated and is shown in FIG. 4. This distortion plot was used to calculate several system correctables. The validity of the calculated correctables were experimentally verified—see Table 1 and FIG. 5 which shows close agreement with FIG. 4.

TABLE 1

| Correctable | Calculated Value Zygo Measurement | Measured Value Using Dynamic Distortion Test |
|---|---|---|
| Translation x [nm] | −8.69 | −7.56 (σ 2.67) |
| Translation y [nm] | 19.07 | 20.62 (σ 3.18) |
| Scan skew [µrad] | −0.31 | −0.39 (σ 0.04) |
| Magnification x* [ppm] | 0.79 | 0.94 (σ 0.12) |
| Magnification y* [ppm] | 0.20 | 0.20 (σ 0.09) |

The dynamic distortion test is a standard test to measure the image displacement (overlay performance).

Embodiment 2

In a second embodiment of the invention, which is otherwise the same as the first embodiment, the pellicle shape, thickness, etc. is measured using a tool in the lithographic apparatus. There are two variants to this embodiment, the first using a white light interferometer and the second using a plurality of image sensor (TIS) measurements.

In the first variant of the second embodiment, a White Light Interferometer (WLI) is used to measure the pellicle shape and thickness. With this method information is obtained for the whole pellicle area. Using this shape the system adjustments can be calculated and implemented to correct for overlay errors caused by pellicle deformation and shift in best object plane by the pellicle thickness (as described above).

Commercially available White Light Interferometers are capable of accurately measuring the absolute height of an optical surface. By scanning the mask, with pellicle attached, through the WLI beam(s) full field information of the pellicle shape is obtained. A WLI may already be provided in the lithographic apparatus for use in set-up and calibration of the mask stage.

In the second variant of the second embodiment, the pellicle shape is locally probed using a Transmission Image Sensor (TIS sensor), a sensor which detects an image projected by the lithographic apparatus, making use of the exposure wavelength and illumination settings. The TIS measurement is performed through the pellicle. A multi-point TIS measurement can be used to determine for each point best focus, image translation and other aberrations (e.g., spherical). A precondition for using this method is that pellicle shape is predetermined within certain boundaries. If the pellicle shape is relatively simple, relatively few measurements can be sufficient to predict the pellicle shape. Thus, the necessary corrections can be done based on a limited number of measurements. In a third embodiment, described below, the pellicle shape is made more predictable. Only localized field information (for a limited number of field points) is needed to predict the pellicle shape and thus the system correctables. The standard TIS measurement (determination of x, y and z) through a pellicle only provides information about the pellicle global tilt resulting in an image translation. Additional TIS HAPVAP (horizontal (x) aligned position—vertical (y) aligned position) measurements provide in information about the shift in Best Object Plane (BOP), and hence the shift in the plane of best focus. If the pellicle has a one-dimensional shape, multi-point TIS measurements can be used to measure this shape and correct not only for translation but also for magnification, third order distortion and possibly other imaging effects (e.g., aberration control).

The concept of multi-point TIS measurements is not only beneficial for applying pellicle corrections but has much more broader applicability. In general this method can be used to correct for reticle deformations causing focus and overlay errors. Currently, four point reticle alignment information, derived using the TIS is used to correct for focus, Ry-image-tilt, Rx-scan-tilt and linear roll (corkscrew) during an exposure. However, also large defocus contributors appear to be present in the higher orders of reticle curvature, e.g., quadratic wedge and field curvature. To correct for these, the higher order shape of the reticle (in z) must be known. This can be achieved by providing additional alignment marks on the reticle along the scanning and/or slit direction. So applying the concept of multiple TIS (>4) measurements, for example, the multi-point information in the scanning direction can be used to obtain information on quadratic scan tilt (Q-wedge) and other higher orders in z in the scan direction. Whereas the multi-point information in the slit direction can be used to correct for pellicle (one-dimensional pellicle bow through the slit) and/or reticle deformation, a fit of the accumulated z-data is used to feed-forward correct for the height of the reticle and/or, when applicable, pellicle shape during a scan. The reticle height is corrected on the reticle table and pellicle effects are corrected using several system adjustables (e.g., lens elements, reticle table height, focus (at wafer level)). The above described concept of multi-point TIS measurements can be used independently of the pellicle characterization and can significantly reduce the reticle shape contribution to the focus budget regardless of the flatness degree of the reticle.

Embodiment 3

In a third embodiment of the invention, in addition to the pellicle characterization used in the first and second embodiments, the shape of the pellicle is controlled so as to make its effects more easily correctable.

Previously, the aim in mounting the pellicle has been to mount the pellicle to the mask so that the pellicle is perfectly flat. In other words, curvature of the pellicle and wedge of the pellicle are minimized. In order to achieve this, gravity compensation (to control curvature) and careful pellicle grinding and polishing (to control wedge) are applied. The pellicle sag caused by gravity is counteracted by applying a pellicle pre-shape when attaching the pellicle to the pellicle frame. This pre-shaping aims to ensure that when the mask with pellicle is used, the pellicle is perfectly flat.

However, in this embodiment, a controlled substantially one-dimensional pellicle shape/deformation is provided. The pellicle has a known curvature in one direction, along the illumination field or in the scan direction, and a substantially constant cross-section in the perpendicular direction a small amount of curvature in the perpendicular direction may remain but is preferably minimized. The benefit with respect to gravity compensation is that now the pellicle shape has to be controlled in one dimension instead of two. This is technically less challenging and much easier to achieve. The one-dimensional pellicle shape along the slit or scan direction is then compensated for by applying system corrections. It is often simplest to correct pellicle sag in the scan (y) direction, but it is also possible to correct sag in the orthogonal (x) direction. Using beam deflection formulas (see for example Applied Strength of Materials, Robert L Mott $3^{rd}$ Ed 1996 ISBN 0-13-376278-5, which document is hereby incorporated in its entirety by reference), the values for first and third order distortion (and other pellicle induced imaging effects) are obtained. The derivative of the deflection formula is directly, apart from a constant, related to the pellicle induced image displacement so that the pellicle-induced image displacement can be estimated.

Below, three examples are described showing that one-dimensional pellicle deformation can be described with a second and fourth order equation resulting in a first (magnification) and third order distortion. A fourth example deals with more complex pellicle shapes that induce an image distortion that can be corrected for using system variables. It is noted that in the below-described examples for clarity the global pellicle tilt is taken equal to zero. In general a tilt would result in an image translation which can be automatically corrected (using for example the results of known alignment processes).

Figure 6:
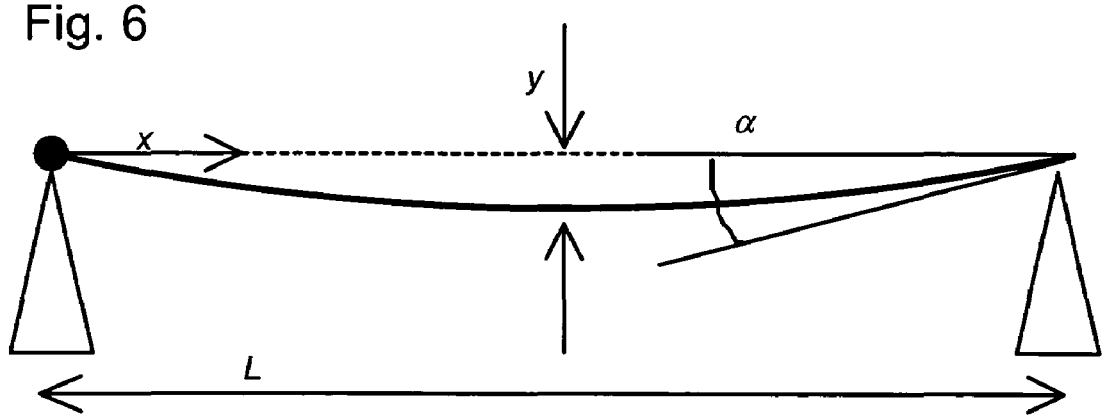
FIG. 6 is a diagram of pellicle shape under gravity for a pellicle fixed at two parallel edges.
Figure 7:
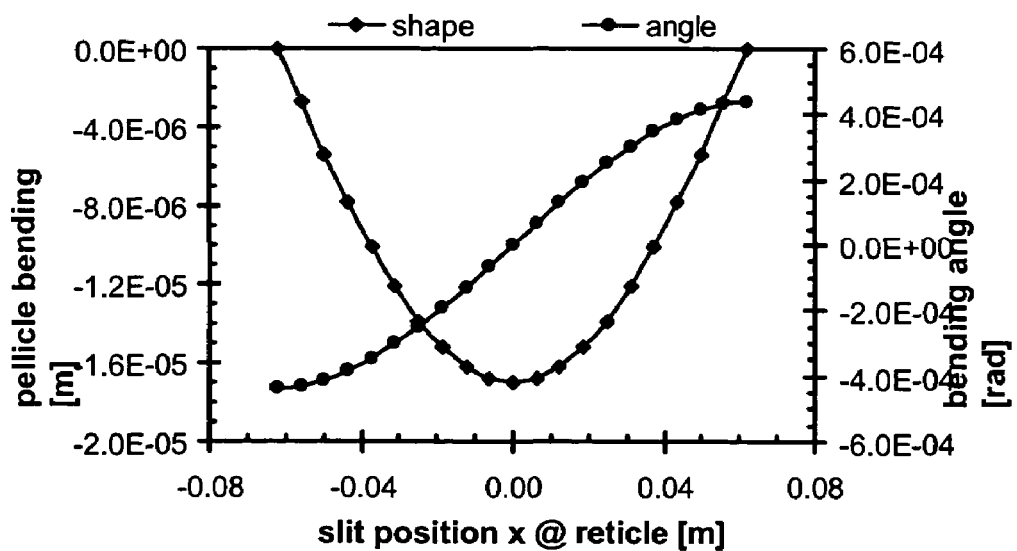
FIG. 7 is a graph of bending amount and angle with position of the pellicle of FIG. 6.

In the first example, instead of applying gravity compensation to the pellicle, the pellicle bending in the slit is the same as bending caused by gravity, as shown in FIG. 6. The pellicle is attached to the frame at two parallel edges so that the tilt of the pellicle equals that of a pellicle that is supported at the edges and bends freely due to gravity. So the pellicle is fixed at the edges at an angle α that equals the angle of free beam deflection (FIG. 6). The pellicle deflection y(x) is given by:

$$y(x) = \frac{-w \cdot x \cdot (L^3 - 2Lx^2 + x^3)}{24E \cdot I} \quad (4)$$

where w [N/m] is the applied force due to gravity per length unit, x [m] the pellicle (beam) position, L [m] the pellicle (beam) length, E [Pa] Young's modulus and I [m$^4$] the moment of inertia. Using the data presented in Table 2 the pellicle deflection through the slit and the corresponding bending angle for a 800 μm thick fluorine-doped quartz pellicle can be evaluated, as shown in FIG. 7.

TABLE 2

Pellicle Material Properties

| Material property | Value | |
|---|---|---|
| Young's modulus (E) | 73 | [GPa] |
| Poisson's ratio (v) | 0.16 | [—] |
| Density (ρ) | 2.20 ± 0.01 | [g cm$^{-3}$] |
| Pellicle refractive Index @ 157.6 nm (n$_2$) | 1.67 | [—] |
| Gas refractive Index @ 157.6 nm (n$_1$) | 1.00 | [—] |
| Gravitation constant (g) | 9.8 | [m/s$^2$] |
| Pellicle length (L) | 12.4 | [cm] |
| Pellicle thickness (th) | 800 | [μm] |
| Pellicle width (b) | 14.9 | [cm] |
| Gravity induced force per pellicle length (w) | g · (L · b · th) · ρ/L | [N/m] |
| Moment of inertia (I) | $\frac{1}{12} \cdot b \cdot th^3$ | [m$^4$] |

It can be seen that $\frac{w \cdot L}{I} = \frac{g \cdot L \cdot \rho}{\frac{1}{12} \cdot th^2}$ For this purpose the formula for the beam deflection was rewritten changing the point x=0 from the edge of the pellicle to the center. This is done because the derivative of the pellicle deflection viz. the bending angle is proportional (with factor th (1−n$_2$/n$_1$)) to the induced image distortion (M, D2, D3 etc.) which can than directly be derived from the pellicle deflection (distortion is described from the center of the slit). The pellicle deflection and corresponding angle is then given by:

$$y(x) = \frac{-w \cdot L \cdot \left(\frac{5}{16}L^3 - 1.5Lx^2 + x^4/L\right)}{24E \cdot I} \quad (5)$$

and $$y'(x) = \frac{-w \cdot L \cdot (-3Lx + 4x^3/L)}{24E \cdot I} \quad (6)$$

This gives the following expression for the distortion d(x$_w$) at wafer level due to pellicle bending:

$$d(x_w) = \quad (7)$$
$$\frac{1}{4} \frac{-w \cdot L \cdot (-3L \cdot (4x_w) + 4 \cdot (4x_w)^3/L)}{24E \cdot I} \cdot th \cdot \left(1 - \frac{n_1}{n_2}\right) = M \cdot x_w + D3 \cdot x_w^3$$

where x$_w$ [m] the slit position at wafer level (xw=xl4), th [m] the pellicle thickness, n$_1$ [−] is the refractive index of the gas mixture surrounding the pellicle, n$_2$ [−] is the refractive index of the pellicle, M [nm/mm] is the pellicle-induced magnification and D3 [nm/cm$^3$] the third order distortion. Using this description is it directly clear that the pellicle deflection can be written using only even powers of x resulting in odd powers of x for the deflection angle and thus also for the distortion. Odd distortion terms in particular can be easily automatically corrected in the current lithographic apparatus making distortion correction for a one-dimensional predefined pellicle shape possible. For this case it can be easily shown that:

$$M = \frac{1}{4} \frac{3w \cdot L^2 \cdot 4}{24E \cdot I} \cdot th \cdot \left(1 - \frac{n_1}{n_2}\right) \quad (8)$$

and $$D3 = \frac{1}{4} \frac{-4w \cdot 4^3}{24E \cdot I} \cdot th \cdot \left(1 - \frac{n_1}{n_2}\right) \quad (9)$$

Using the values given in table 2 above, these equations give a magnification M of 3.416 ppm and a third order distortion D3 of −4.740 nm/cm$^3$ for a 800 μm pellicle at 157 nm.

From which it is clear that distortion is not necessarily a limiting factor for using a non-flat pellicle. Assuming that the Zernike coefficients for a deflected reticle scale with the pellicle thickness variation in z the induced additional aberrations with respect to the perfect pellicle case are negligible.

Figure 8:
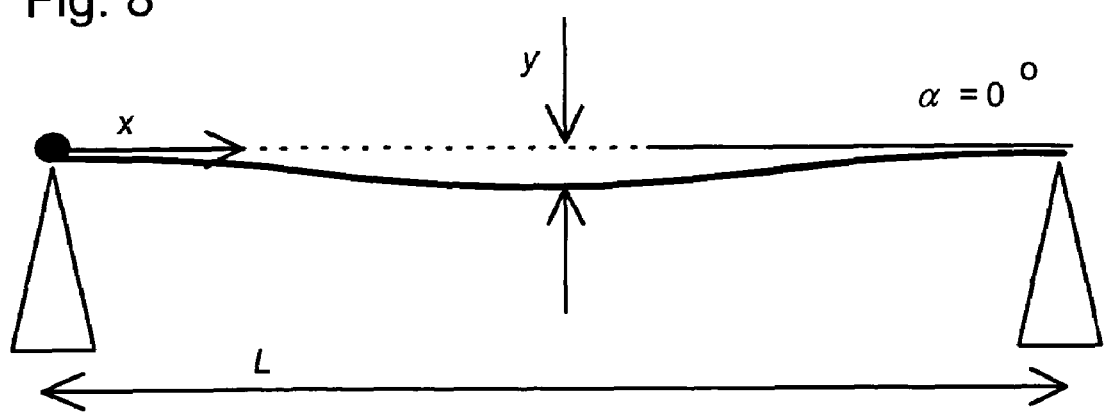
FIG. 8 is a diagram of pellicle shape under gravity for a pellicle fixed at two edges at an angle of 0°.

In the second example, the pellicle is fixed to the frame so that the angle of tilt in the scan direction at the frame is zero. This arrangement is shown in FIG. 8.

Figure 9:
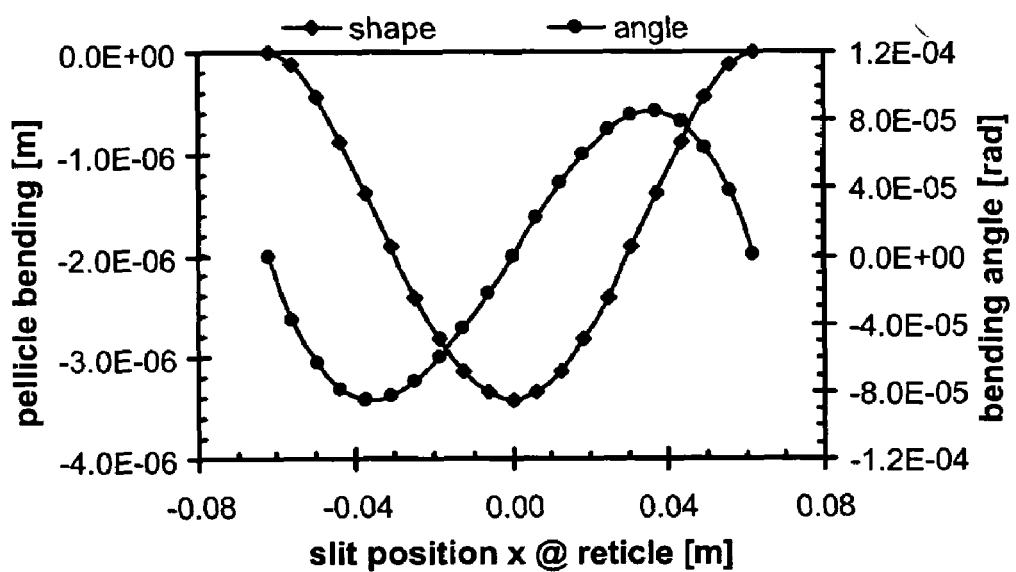
FIG. 9 is a graph of bending amount and angle with position of the pellicle of FIG. 8.

For such an arrangement, the pellicle deflection y(x) is given by (see reference above):

$$y(x) = \frac{-w \cdot x^2 \cdot (L - x)^2}{24E \cdot I} \quad (10)$$

in which the constants and variables are as defined above. The pellicle bending amount and angle are shown in FIG. 9. Again, the formula for the beam deflection was rewritten changing the point x=0 from the edge of the pellicle to the center. This is done because the derivative of the pellicle deflection with respect to the bending angle is proportional (with factor th (1−n$_2$/n$_1$)) to the induced image distortion (M, D2, D3 etc.), which can than directly be derived from the pellicle deflection (distortion is described from the center of the slit). The pellicle deflection and corresponding angle are then given by:

$$y(x) = \frac{-w \cdot L \cdot \left(\frac{1}{16}L^3 - 0.5Lx^2 + x^4/L\right)}{24E \cdot I} \quad (11)$$

and $$y'(x) = \frac{-w \cdot L \cdot (-Lx + 4x^3/L)}{24E \cdot I} \quad (12)$$

This results for the distortion d(x$_w$) at wafer level due to pellicle bending in:

$$d(x_w) = \tag{13}$$

$$\frac{1}{4}\frac{-w \cdot L \cdot (-L \cdot (4x_w) + 4 \cdot (4x_w)^3/L)}{24E \cdot I} \cdot th \cdot \left(1 - \frac{n_1}{n_2}\right) = M \cdot x_w + D3 \cdot x_w^3$$

Again, the pellicle deflection can be written using only even powers of x resulting in odd powers of x for the deflection angle and thus also for the distortion. Odd distortion terms in particular can be easily automatically corrected in current lithographic apparatus making distortion correction for a one-dimensional predefined pellicle shape possible. For this case it can be easily shown that:

$$M = \frac{1}{4}\frac{w \cdot L^2 \cdot 4}{24E \cdot I} \cdot th \cdot \left(1 - \frac{n_1}{n_2}\right) \tag{14}$$

and $$D3 = \frac{1}{4}\frac{-4w \cdot 4^3}{24E \cdot I} \cdot th \cdot \left(1 - \frac{n_1}{n_2}\right) \tag{15}$$

Using the values given in table 2 above, these equations give a magnification M of 1.139 ppm and a third order distortion D3 of −4.740 nm/cm³ for a 800 μm pellicle at 157 nm.

Again it is clear that distortion is not necessarily a limiting factor for using a non-flat pellicle. Assuming that the Zernike coefficients for a deflected pellicle scale with the pellicle sag induced thickness variation in z the induced additional aberrations with respect to the perfect pellicle case are negligible.

Figure 10:
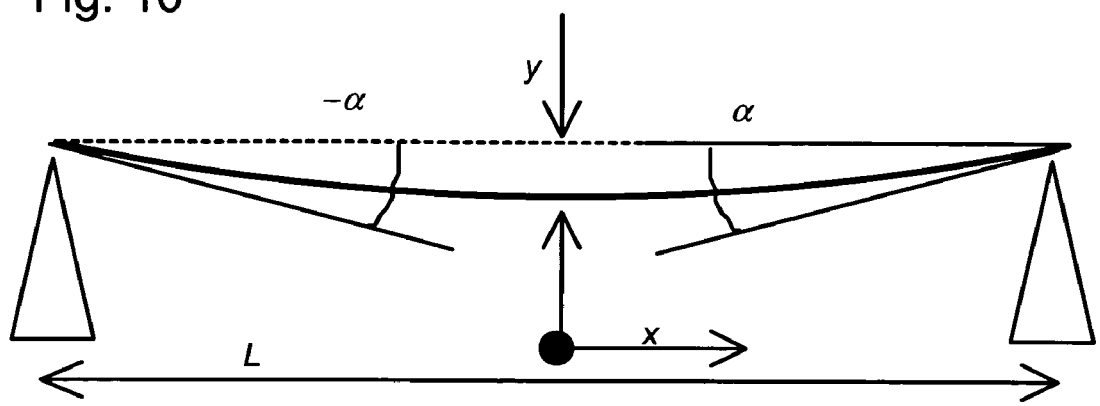
FIG. 10 is a diagram of pellicle shape under gravity for a pellicle fixed at two edges at an arbitrary angle.

In the third example, the pellicle is fixed to the frame at an arbitrary angle α. This arrangement is shown in FIG. 10.

By shifting the point x=0 to the center of the pellicle the pellicle deflection and corresponding angle are given by:

$$y(x) = \frac{-w \cdot L \cdot \left(\frac{1}{16}L^3 - 0.5Lx^2 + x^4/L\right)}{24E \cdot I} + \alpha \cdot \left(\frac{x^2 - \frac{1}{4}L^2}{L}\right) \tag{16}$$

and $$y'(x) = \frac{-w \cdot L \cdot (-Lx + 4x^3/L)}{24E \cdot I} + \alpha \cdot \left(\frac{2x}{L}\right) \tag{17}$$

This results for the distortion $d(x_w)$ at wafer level due to pellicle bending in:

$$d(x_w) = \frac{1}{4}\left[\frac{-w \cdot L \cdot (-L \cdot (4x_w) + 4 \cdot (4x_w)^3/L)}{24E \cdot I} + \alpha \cdot \left(\frac{2 \cdot (4x_w)}{L}\right)\right] \cdot th \cdot \left(1 - \frac{n_1}{n_2}\right) \tag{18}$$

$$= M \cdot x_w + D3 \cdot x_w^3$$

Note that only the magnification term depends on the starting angle and not the D3 term. This implies that when a pellicle has a one-dimensional shape a standard alignment process on four markers would be sufficient to obtain the magnification correction (irrespective of the applied α), provided it is adapted to accommodate the pellicle-induced D3 term. The D3 term is known from the standard beam deflection formulas or alternately can be found by using finite element calculations.

From the above formulae, the optimum mounting angle which results in the smallest maximum observed pellicle tilt can be determined and is given by:

$$\alpha = \frac{-w \cdot L \cdot \left(\frac{1}{8}L^2\right)}{24E \cdot I} = \frac{-w \cdot L^3}{192E \cdot I} \tag{20}$$

Figure 11:
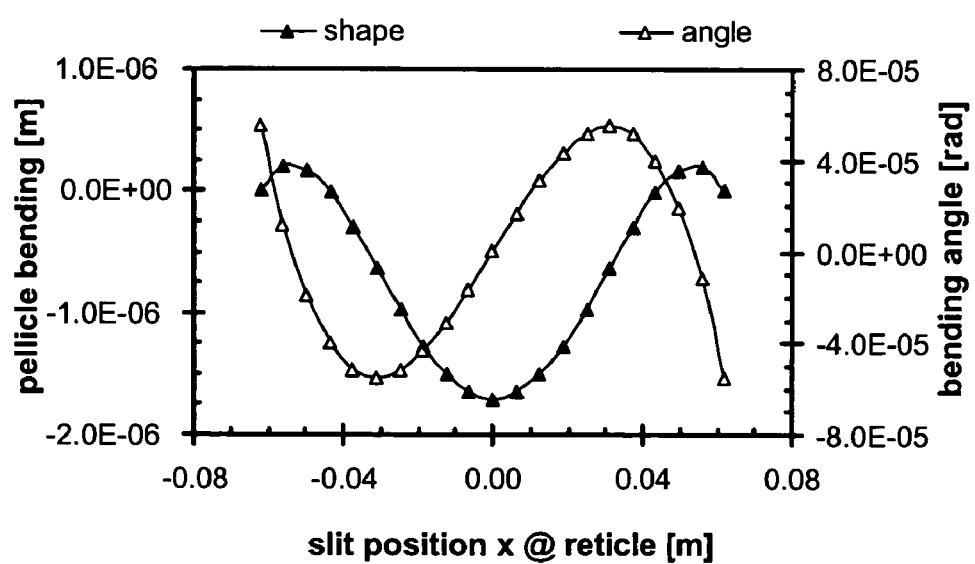
FIG. 11 is a graph of bending amount and angle with position of a pellicle fixed at an optimum angle.

This optimum mounting angle equals also the maximum observed pellicle tilt and results in the minimum image displacement. Using the data as presented in table 2 above, an optimum angle α of −55 μrad is obtained. The pellicle deflection and tilt for this mounting angle are shown in FIG. 11. It can also be shown that:

$$M = \frac{4}{4}\left(\frac{w \cdot L^2}{24E \cdot I} + \frac{2\alpha}{L}\right) \cdot th \cdot \left(1 - \frac{n_1}{n_2}\right) \tag{21}$$

and $$D3 = \frac{1}{4}\frac{-4w \cdot 4^3}{24E \cdot I} \cdot th \cdot \left(1 - \frac{n_1}{n_2}\right) \tag{22}$$

Using the values given in table 2 above, these equations give a magnification M of 0.854 ppm and a third order distortion D3 of −4.740 nm/cm³ for a 800 μm pellicle at 157 nm.

The three examples discussed above address pellicle curvature in the illumination slit. However, the same equations can be applied to pellicle curvature in the scan direction, simply with a change in value of L.

In a fourth example, a more complex pellicle shape is employed. In general, the shape of a given pellicle can be expressed as a function of x and y, S(x,y), given by:

$$S(x,y) = c + t_x \cdot x + t_y \cdot y + m_x \cdot x^2 + m_y \cdot y^2 + symrot \cdot (xy) + d3_x \cdot x^4 + NCE(x,y)dxdy \tag{23}$$

where the fitting parameters $t_x$, $t_y$, $m_x$, $m_y$, symrot, $d3_x$ and NCE(x,y) are related to the system parameters translation x, translation y, magnification x, magnification y, symmetric rotation (scan skew and lens rotation), 3rd order distortion in x and Non-Correctable Error in overlay, respectively.

Presented with a pellicle of arbitrary shape, two approaches are possible. In both, the shape is represented in the form of equation (23) and values for the fitting parameters are determined, then used during exposures to apply corrections. In the first approach, the values of the fitting parameters are chosen using a least squares fit to minimize the value of the non-correctable error NCE(xy)dxdy over the whole of the imaging field. An alternative approach is to select the fitting parameters so that the largest value of NCE(x,y)dxdy in the imaging field is as small as possible. Other optimization criteria can also be employed. For example, the pellicle shape can be optimized to minimize image fading.

Image fading occurs when magnification and third order distortion corrections are applied to account for a substantially one-dimensional pellicle shape. The corrections are applied to account for the pellicle-induced effects in the slit direction (perpendicular to the scan direction) but introduce errors in the scan direction. These errors will average out to zero due to the scan but instead cause image fading due to the fact that the apparent feature position varies during a scan. The amount of image fading is dependent on the moving standard deviation (MSD) of a field point during a scan. In general imaging fading is not a problem provided the MSD is less than 10% of the relevant feature size. An optimum angle for the pellicle mount can be calculated to minimize image fading and may be negative, i.e., the pellicle centre is closer to the mask than are the edges. A limit of MSD <10 to 20% of the critical dimension may be used to define an allowable range of pellicle mounting angle.

Alternatively, equation 23 can be used in designing a shape for a pellicle. Rather than being constrained to the simple forms of the earlier examples, the pellicle shape can be a linear combination of correctible shapes, that is shapes leading to distortions that are correctable by available control parameters of the lithographic apparatus. In other words, the pellicle shape can be any shape satisfying the equation:

$$S(x,y)=c+t_x \cdot x+t_y \cdot y+m_x \cdot x^2+m_y \cdot y^2+symrot \cdot (xy)+d3_x \cdot x^4 \quad (24)$$

Note of course that the exact form of this equation will depend on the available system parameters of a given lithographic projection apparatus that can be used to adjust for pellicle induced distortion. Also corrections for pellicle-induced distortions may be combined with corrections for other factors.

Once a pellicle shape has been determined, it should be mounted to the mask in such a manner that the desired shape is adopted in use and also a sealed enclosure for the mask pattern is made, to prevent particle contamination of the mask pattern. Several approaches to this can be taken.

Firstly, the frame for the pellicle can be ground to, otherwise formed in, the shape that the pellicle is designed to adopt so that a seal around the whole perimeter can be made.

Secondly, where the pellicle is to be supported along two edges only, an upstanding rim or flange can be provided along the non-supporting edges of the frame so that it is very close to, but not touching, the edge of the pellicle. Such a rim may also be shaped to act as a spoiler to reduce scan-speed dependent forces on the pellicle (e.g., deriving from Bernoulli effects) that may alter its shape. Of course, such forces may also be taken into account when determining the expected shape the pellicle will adopt in use and hence the corrections to be applied.

Thirdly, with the pellicle in the shape that it is to adopt in use, sealing material can be introduced into any gaps between the frame and pellicle, e.g., by a capillary infiltration technique.

EXAMPLE

Figure 14:
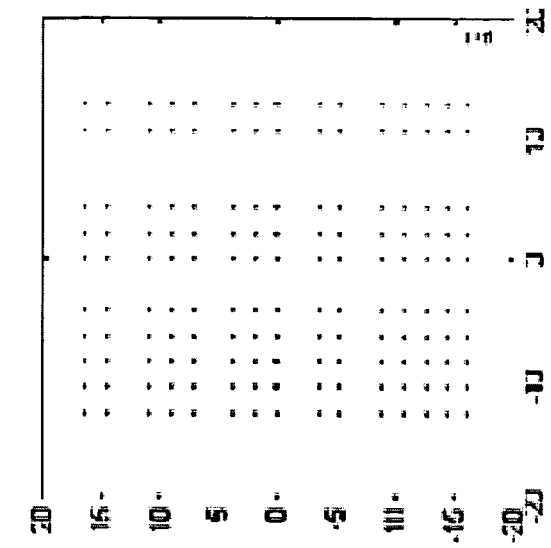
FIG. 14 is a graph of the net average raw distortion in the example of the invention after the correction has been applied.
Figure 13:
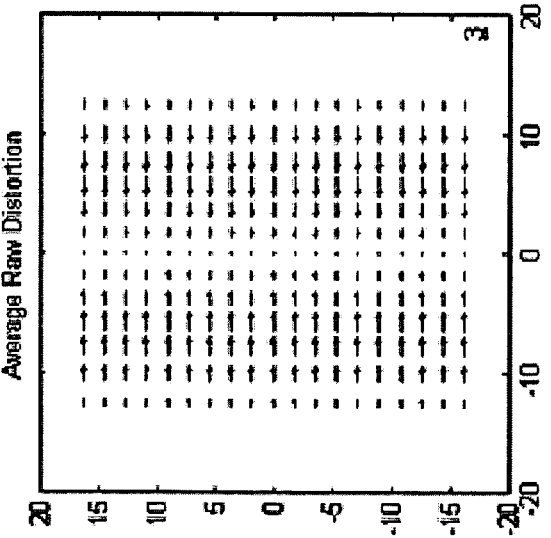
FIG. 13 is a graph of average raw distortion applied as a correction in the example of the invention.
Figure 12:
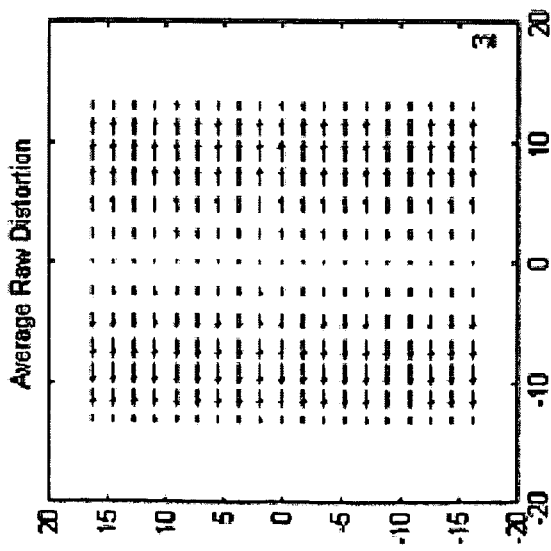
FIG. 12 is a graph of average raw distortion induced by a pellicle to which an example of the invention is applied.

FIGS. 12, 13 and 14 illustrate an example of the invention. A sample pellicle mounted to have a one dimensional shape with angle 0° at the edges is determined to give rise to the distortions shown in FIG. 12. Using appropriate system correctables, a compensating distortion as shown in FIG. 13 is applied. The resulting net distortion in the aerial image is considerably reduced, virtually eliminated, as shown in FIG. 14.

Embodiment 4

In a fourth embodiment of the invention, arrangements are made to compensate for Bernoulli effects which may distort the pellicle during a scan.

In a lithographic apparatus that performs scanning exposures, the speed of movement of the mask table may be very high due to the fact that the mask is 4 or 5 times larger that the wafer, and hence moves 4 or 5 times faster, and the need to have a high throughput. Velocities of the order of 0.6 ms$^{-1}$ have been calculated to cause small, but acceptable deformations of the pellicle. However the effects are proportional to the square of the scan speed so that an increase in scan speed to 2 ms$^{-1}$ will give a tenfold increase in the pressure differences across the pellicle.

Because the pressure difference varies at different points over the area of the pellicle this leads to distortion of the pellicle that is velocity dependent. Various measures may be taken to ameliorate or compensate for the resulting image effects.

First of all, the pellicle frame may be provided with, or shaped to have the effect of, a spoiler 15 or spoilers that minimize pressure differences across the pellicle. Spoiler(s) may also or instead be attached to the mask, the pellicle or the mask table. Secondly, the purge gas system may be arranged so that there is a flow of purge as parallel to and in the same sense as the scan velocity. This may entail a reversal of the purge gas flow between scans in opposite senses. If the purge gas flow is with the mask table scan movement, the relative velocity of the table through the atmosphere is reduced and so therefore the Bernoulli effects. Thirdly, the effect of the pellicle shape changes during a scan during an scan or the projected image may be calculated or measured in advance and appropriate corrections made in the same way as with other pellicle effects.

Embodiment 5

In a fifth embodiment of the invention problems that may be caused in the process of mounting the pellicle to the mask are addressed.

Above, it was shown that overlay errors caused by the pellicle, if its shape is suitably controlled, are proportional to $Ax+Bx^3$ and are correctable via adjustment of magnification and third order distortion. However, if the origin of the coordinate system of the pellicle is displaced from that of the mask, additional terms arise and the image displacement becomes proportional to $z^1(x)$, where:

$$Z^1(x)=(-2Ac+4Bc^3)+2(A+6Bc^2)x+3(-4Bc)x^2+4(B)x^3$$

in which c is the displacement of the pellicle origin relative to the mask origin. These additional terms can result in non-correctable overlay errors.

Further errors may also arise if the mounting angles of the pellicle at its two edges are not the same. Such a situation leads to a non-symmetric pellicle shape but this can be represented by a formula of the form $Z^1(x)=Ax^2+Bx^4$ with a displaced origin.

In this embodiment, the above problems can be minimized by correct displacement of the pellicle to the mask. Accordingly, the pellicle shape is measured before and/or during the mounting process. An optimum position for the pellicle is calculated—the optimum position may be the position that minimizes image displacements or minimizes non-correctable image displacements—and the pellicle is fixed to the mask at the optimum position.

Measurement of the pellicle shape can be performed, for example, by Fourier transform phase shifting interferometry. Suitable alignment marks, e.g., as known in the art of lithography, are provided on the pellicle and mask and adjustment of the two can then be performed with known techniques.

Embodiment 6

In a sixth embodiment of the invention, the mask is replaced by a programmable patterning device (also referred to as a spatial light modulator) such as a programmable mirror array on a programmable LCD array (sometimes referred to as a light valve). More information on suitable programmable mirror arrays can be found in U.S. Pat. No. 5,296,891, U.S. Pat. No. 5,523,193, WO 98/38597 and WO 98/33096 and on suitable LCD arrays in U.S. Pat. No. 5,229,872, which documents are hereby incorporated by reference.

The programmable patterning device, especially if a programmable mirror array, is very sensitive to dust and other contaminants and so is housed in a box or package into which it can be mounted and used in the lithographic apparatus still sealed. The projection beam enters and leaves the package through one or more windows which are substantially transparent to the radiation of the projection beam but, being of non-negligible thickness and having a refractive index different than the surrounding medium, are likely to introduce undesirable optical effects. At least the effects of the window downstream of the programmable patterning device are characterized and compensated for in the same manner as in the first to fifth embodiments described above.

While specific embodiments of the invention have been described above, it will be appreciated that the invention may be practiced otherwise than as described. For example, while the invention has been described in relation to a chromed mask, it is of course applicable to other types of mask including chromeless and other types of phase-shifting mask. Furthermore, the invention may be applied to this or soft pellicles and other imaging effects caused by an imperfect plan parallel plate, e.g., the liquid film used in immersion lithography. For immersion lithography the wafermap and the shape of the immersion lens element can be used compensate for the shape of the immersion medium. The invention may also be applied to pellicles other than adjacent the mark; for example in EUV a pellicle may be employed between the substrate and projection lens to protect the projection lens from contamination emitted by the resist. In general the imaging effects scale with thickness. For relatively thick pellicles (such as the 800 μm hard pellicle) it is clear that corrections need to be applied, considering only the shift in best object plane. However, the described correction strategies are not limited to hard pellicles but also applicable for thin pellicles or even other parallel plates in the optical path such as a liquid film. Also it should be noted that although the examples deal with pellicle deformation in the illumination field, also (one-dimensional) deformation in the scan direction are correctable by using, for example, the scan speed as correctable. Furthermore, while the invention has been described above in relation to exposure wavelengths that necessitate the use of a thick or hard pellicle, such particles. Such pellicles and the invention may of course be used at exposure wavelengths for which thin or soft pellicles are available. A hard pellicle may be preferred in such cases because it will be less susceptible to Bernoulli effects, may be reused and may be cleanable. The description is not intended to limit the invention.

The invention claimed is:

1. A mask having a pellicle fixed to a frame in spaced relation thereto, wherein said pellicle is fixed to said frame such that in use during exposure in a lithographic apparatus, the pellicle adopts a shape that introduces imaging effects that are substantially compensatable for by adjustment of available system parameters of a lithographic apparatus with which the mask is to be used.

2. A mask according to claim 1 wherein said pellicle is fixed to said frame along two parallel edges and compliantly mounted along the other edges such that said pellicle adopts a substantially one-dimensional shape when in the orientation in which it will be used for exposures in a lithographic projection apparatus.

3. A mask according to claim 2 wherein said pellicle is fixed to said frame at said two parallel edges at an angle equal to that that would be adopted were the pellicle allowed to bow freely under gravity.

4. A mask according to claim 2 wherein said pellicle is fixed to said frame at both of said parallel edges at an angle of 0°.

5. A mask according to claim 1, further comprising a spoiler attached to one of said mask, said pellicle or said frame, said spoiler shaped to reduce Bernoulli effects that would otherwise distort said pellicle when said mask moves during an exposure.

6. A mask according to claim 1, wherein the frame has a shape that conforms with the shape of the pellicle so that a seal around the periphery of the pellicle can be made.

7. A mask according to claim 1, wherein the pellicle is supported on only two edges of the frame and further comprising a rim provided along the non-supporting edges of the frame, the rim reaching close to, but not touching, the edge of the pellicle.

8. A mask according to claim 1, wherein said pellicle is fixed to said frame at an angle to minimize image fading.

9. A mask according to claim 1, further comprising a sealing material provided in a gap between the pellicle and the frame.

10. A mask having a pellicle fixed to a frame in spaced relation thereto, wherein said pellicle is fixed to said frame such that in use during exposure in a lithographic apparatus, the pellicle adopts a substantially one-dimensional non-flat shape when in the orientation in which it will be used for the exposure in the lithographic apparatus.

11. A mask according to claim 10, wherein the pellicle introduces imaging effects that are substantially compensatable for by adjustment of available system parameters of the lithographic apparatus.

12. A mask according to claim 10, wherein the pellicle is fixed to said frame at two parallel edges at an angle equal to that that would be adopted were the pellicle allowed to bow freely under gravity.

13. A mask according to claim 10, wherein said pellicle is fixed to said frame at two parallel edges at an angle of 0°.

14. A mask according to claim 10, further comprising a spoiler attached to one of said mask, said pellicle or said frame, said spoiler shaped to reduce Bernoulli effects that would otherwise distort said pellicle when said mask moves during an exposure.

15. A mask according to claim 10, wherein the frame has a shape that conforms with the shape of the pellicle so that a seal around the periphery of the pellicle can be made.

16. A mask according to claim 10, wherein the pellicle is supported on only two edges of the frame and further comprising a rim provided along the non-supporting edges of the frame, the rim reaching close to, but not touching, the edge of the pellicle.

17. A mask according to claim 10, wherein said pellicle is fixed to said frame at an angle to minimize image fading.

18. A mask according to claim 10, further comprising a sealing material provided in a gap between the pellicle and the frame.

* * * * *